United States Patent
Lan

(10) Patent No.: US 9,647,702 B2
(45) Date of Patent: May 9, 2017

(54) METHOD FOR AND DEVICE FOR REDUCING PEAK TO AVERAGE POWER RATIO

(71) Applicant: HON HAI PRECISION INDUSTRY CO., LTD., New Taipei (TW)

(72) Inventor: Te-Chih Lan, New Taipei (TW)

(73) Assignee: HON HAI PRECISION INDUSTRY CO., LTD., New Taipei (TW)

( * ) Notice: Subject to any disclaimer, the term of this patent is extended or adjusted under 35 U.S.C. 154(b) by 0 days.

(21) Appl. No.: 14/829,806

(22) Filed: Aug. 19, 2015

(65) Prior Publication Data

US 2016/0065253 A1 Mar. 3, 2016

(30) Foreign Application Priority Data

Aug. 26, 2014 (TW) .............................. 103129360 A

(51) Int. Cl.
*H04L 5/12* (2006.01)
*H04B 1/00* (2006.01)
(Continued)

(52) U.S. Cl.
CPC ....... *H04B 1/0475* (2013.01); *H04L 27/2614* (2013.01); *H04S 1/007* (2013.01);
(Continued)

(58) Field of Classification Search
CPC .......... H04B 1/0483; H04B 1/40; H04B 1/10; H04B 1/16; H04B 1/18; H04B 1/7097;
(Continued)

(56) References Cited

U.S. PATENT DOCUMENTS 5,783,969 A * 7/1998 Luz .......................... H03F 3/602
330/124 R
6,314,146 B1 * 11/2001 Tellado ............... H04L 27/2626
375/285

(Continued)

FOREIGN PATENT DOCUMENTS

TW 201012145 A1 3/2010
TW 201114231 A 4/2011

(Continued)

OTHER PUBLICATIONS

"An Overview of Peak-to-Average Power Ratio Reduction Techniques for Multicarrier Transmission" by Seung Hee Han,Stanford University Jae Hong Lee, Seoul National University, Wireless Communications, IEEE (vol. 12 ,Issue: 2 ) Apr. 2005 p. 56-65.

*Primary Examiner* — Young T Tse
*Assistant Examiner* — Sarah Hassan
(74) *Attorney, Agent, or Firm* — Steven Reiss

(57) ABSTRACT

The present disclosure provides a method and device for reducing peak to average power ratio. A first communication is analyzed to a first in-phase parameter $X_u$ and a first quadrate parameter $Y_u$; the first in-phase parameter $X_u$ and the first quadrate parameter $Y_u$ are both compressed to a second compressed in-phase parameter $X_u'$ and a second compressed quadrate parameter $Y_u'$; a second compressed communication signal will be synthesized according to the second compressed in-phase parameter $X_u'$ and the second compressed quadrate parameter $Y_u'$. The disclosure can effectively reduce the peak to average power ratio of communication signals.

8 Claims, 9 Drawing Sheets

(51) Int. Cl.
*H04B 1/04* (2006.01)
*H04L 27/26* (2006.01)
*H04S 1/00* (2006.01)

(52) U.S. Cl.
CPC .......... *H04B 1/04* (2013.01); *H04B 2001/045* (2013.01); *H04L 27/26* (2013.01)

(58) Field of Classification Search
CPC ...... H04B 7/0456; H04B 15/02; H04B 17/12; H04B 1/38; H04B 1/0475; H04B 2001/045; H04S 1/007; H04L 27/2614
USPC .................................. 375/259, 260; 381/86
See application file for complete search history.

(56) References Cited

U.S. PATENT DOCUMENTS

| | | | | |
|---|---|---|---|---|
| 6,452,978 | B1* | 9/2002 | Reuven | H04L 27/3411 |
| | | | | 375/265 |
| 7,386,060 | B2* | 6/2008 | Jaenecke | H04L 27/2624 |
| | | | | 375/130 |
| 2002/0159550 | A1* | 10/2002 | Jin | H04L 27/2624 |
| | | | | 375/346 |
| 2003/0067990 | A1* | 4/2003 | Bryant | H03G 7/007 |
| | | | | 375/259 |
| 2004/0131129 | A1* | 7/2004 | Harron | H04L 27/362 |
| | | | | 375/298 |
| 2004/0240588 | A1* | 12/2004 | Miller | H04K 1/00 |
| | | | | 375/340 |
| 2005/0024610 | A1* | 2/2005 | Nishi | G03F 7/70425 |
| | | | | 355/53 |
| 2008/0137881 | A1* | 6/2008 | Bongiovi | H04S 1/007 |
| | | | | 381/86 |
| 2009/0103639 | A1 | 4/2009 | Sankabathula | |
| 2011/0122930 | A1 | 5/2011 | Al-Naffouri | |
| 2011/0317790 | A1* | 12/2011 | Yokokawa | H04L 5/0048 |
| | | | | 375/329 |

FOREIGN PATENT DOCUMENTS

| | | |
|---|---|---|
| TW | 201132067 A1 | 9/2011 |
| TW | 201218705 A1 | 5/2012 |

* cited by examiner

METHOD FOR AND DEVICE FOR REDUCING PEAK TO AVERAGE POWER RATIO

FIELD

The subject matter herein generally relates to communication signal processing technology, and particularly to a method for reducing peak to average power ratio of communication signals and a device using the method.

BACKGROUND

In the existing multi-carrier communication system architecture, a signal is sent out from a transmitter after being dealt with mapping, spreading, serial-parallel transforming, inverse discrete Fourier transforming, digital to analog converting, power amplifying and etc; then, the signal is received by a receiver and restored after being dealt with analog to digital converting, discrete Fourier transforming, parallel-serial transforming, de-spreading, de-mapping and etc.

However, the signal in a multi-carrier communication system is obtained by superimposing a plurality of sub-carrier channel signals, the maximum instantaneous power of the signal may vary greatly with a average power, that will produce a high Peak to Average Power Ratio (PAPR). A higher PAPR requires the power amplifier of the transmitter to have a larger linear dynamic range for avoiding signal distortion.

BRIEF DESCRIPTION OF THE DRAWINGS

Implementations of the present technology will now be described, by way of example only, with reference to the attached figures, wherein.

DETAILED DESCRIPTION

Figure 1:
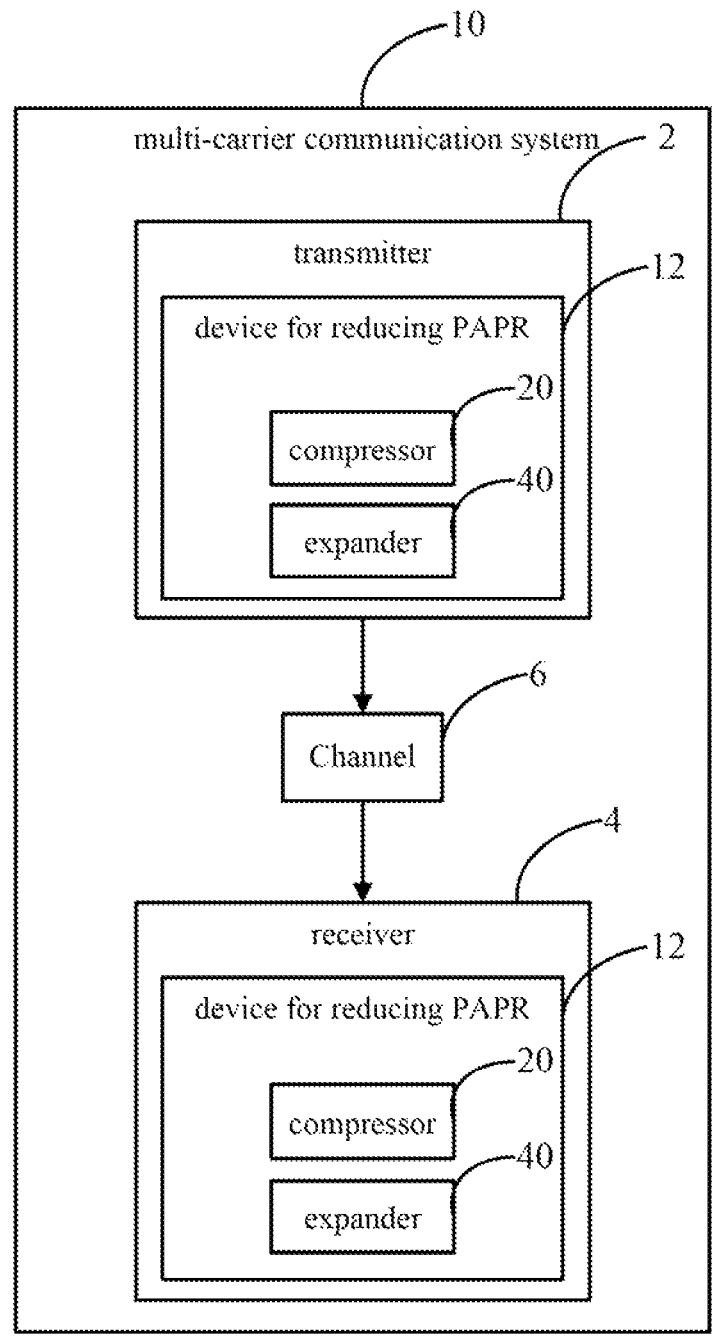
FIG. 1 illustrates an operating environment of an embodiment of a device for reducing peak to average power ratio of communication signal.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale and the proportions of certain parts have been exaggerated to better illustrate details and features of the present disclosure.

It should be noted that references to "an" or "one" embodiment in this disclosure are not necessarily to the same embodiment, and such references mean "at least one."

In general, the word "module" as used hereinafter, refers to logic embodied in computing or firmware, or to a collection of software instructions, written in a programming language, such as, Java, C, or assembly. One or more software instructions in the modules may be embedded in firmware, such as in an erasable programmable read only memory (EPROM). The modules described herein may be implemented as either software and/or computing modules and may be stored in any type of non-transitory computer-readable medium or other storage device. Some non-limiting examples of non-transitory computer-readable media include CDs, DVDs, BLU-RAY, flash memory, and hard disk drives. The term "comprising", when utilized, means "including, but not necessarily limited to"; it specifically indicates open-ended inclusion or membership in a so-described combination, group, series and the like.

FIG. 1 illustrates an operating environment of an embodiment of a device for reducing peak to average power ratio (PAPR). In the illustrated embodiment, the device 12 for reducing PAPR is applied in a multi-carrier communication system 10, the device 12 includes a compressor 20 and an expander 40, wherein the compressor 20 is applied in a transmitter 2 of the multi-carrier communication system 10, the expander 40 is applied in a receiver 4 of the multi-carrier communication system 10. In the illustrated embodiment, the multi-carrier communication system 10 is a system that combines Code Division Multiple Access (CDMA) with Orthogonal Frequency Division Multiplexing (OFDM). The compressor 20 compresses an in-phase parameter and a quadrate parameter of a communication signal, thereby compressing amplitude of the communication signal, reducing the PAPR. The expander 40 expands the in-phase parameter and the quadrate parameter of the communication signal, thereby expanding amplitude of the communication signal, restoring the communication signal.

Figure 2:
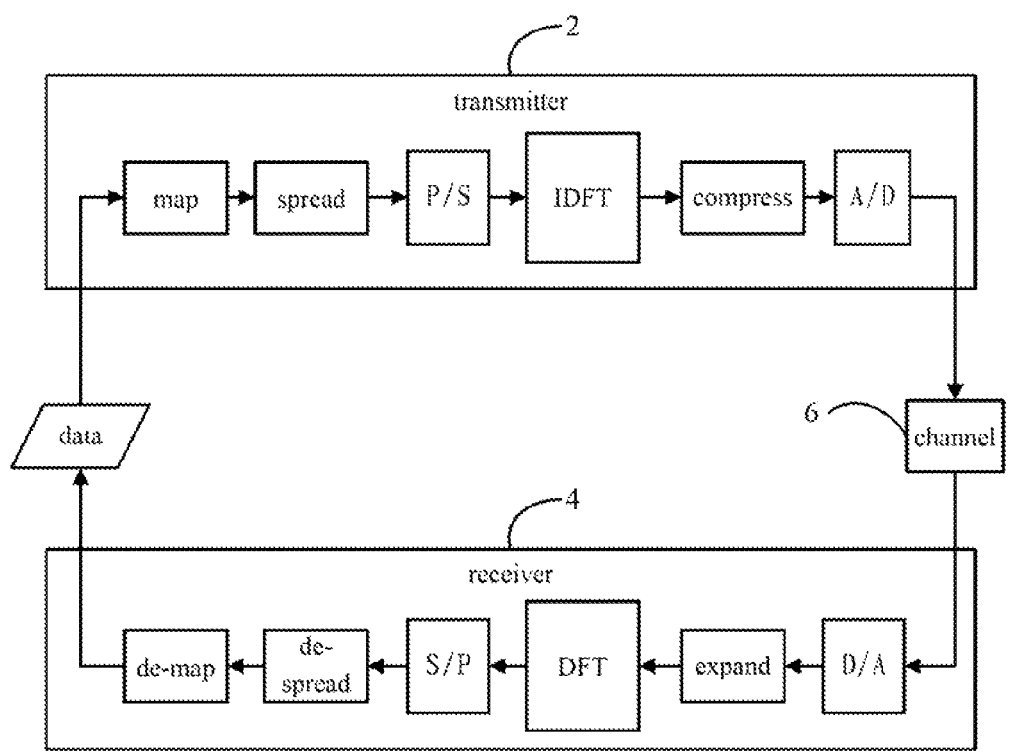
FIG. 2 illustrates a whole process of signal transmission and reception in a multi-carrier communication system.

FIG. 2 illustrates a whole process of the communication signal transmission and reception in the multi-carrier communication system 10. In the illustrated embodiment, the communication signal is sent out from the transmitter 2 in the multi-carrier communication system 10, and to the receiver 4 by channel 6 after being dealt with mapping, spreading, serial-parallel transforming, inverse discrete Fourier transforming, digital to analog converting, power amplifying. After being received by the receiver 4, the communication signal will be restored through digital to analog converting, discrete Fourier transforming, parallel-serial transforming, de-spreading and de-mapping.

In the illustrated embodiment of the multi-carrier communication system 10, the transmitter 2 and the receiver 4 can exchange roles, the receiver 4 is used to transmit communication signals, the transmitter 2 is used to receive communication signals, therefore, the transmitter 2 includes functions or equipment for receiving and transmitting communication signals, as well the receiver 4 includes functions or equipment for receiving and transmitting communication signals. For example, the transmitter 2 also includes the expander 40, and the receiver 4 includes the compressor 20.

Figure 3:
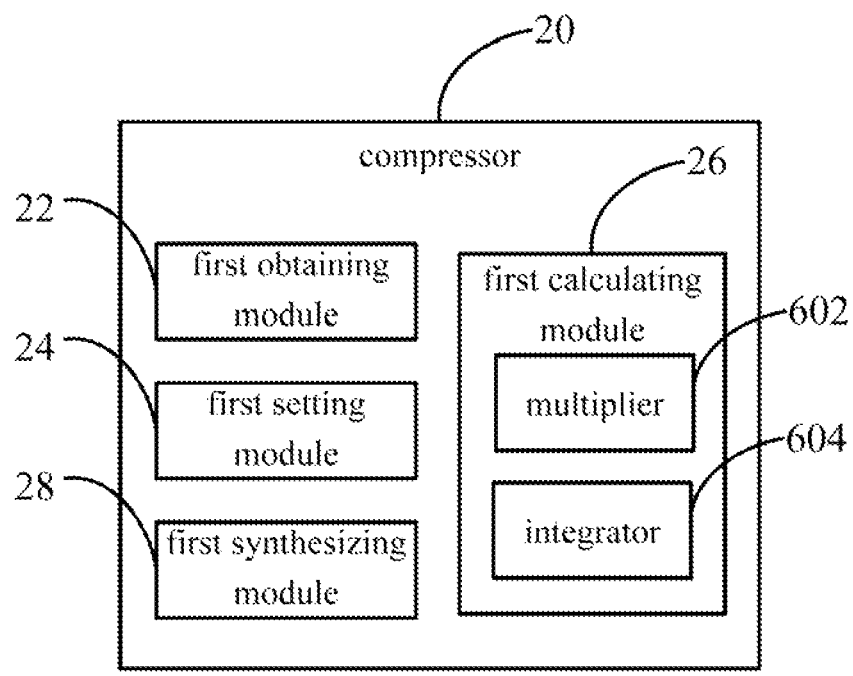
FIG. 3 illustrates a block diagram of an embodiment of function modules of a compressor.

FIG. 3 illustrates a block diagram of an embodiment of function modules of the compressor 20. The compressor 20 includes a first obtaining module 22, a first setting module 24, a first calculating module 26 and a first synthesizing module 28. Wherein, the first calculating module 26 includes a multiplier 602 and an integrator 604.

The first obtaining module 22 analyses a first communication signal, to obtain a first in-phase parameter $X_u$ and a first quadrate parameter $Y_u$. In the illustrated embodiment, the first communication signal is the signal that is dealt with mapping, spreading, serial-parallel transforming and inverse discrete Fourier transforming in the transmitter 2 in the multi-carrier communication system 10. The analysis that is used to decompose the first communication signal into two signal components which have same frequency, have same amplitude of peak, but are 90 degrees out of phase with each other, generally, a sinusoidal signal is used to describe the first in-phase parameter $X_u$, a cosine signal is used to describe the first quadrate parameter $Y_u$. The amplitude of the first communication signal is $\rho_u = \sqrt{X_u^2 + Y_u^2}$.

Figure 4:
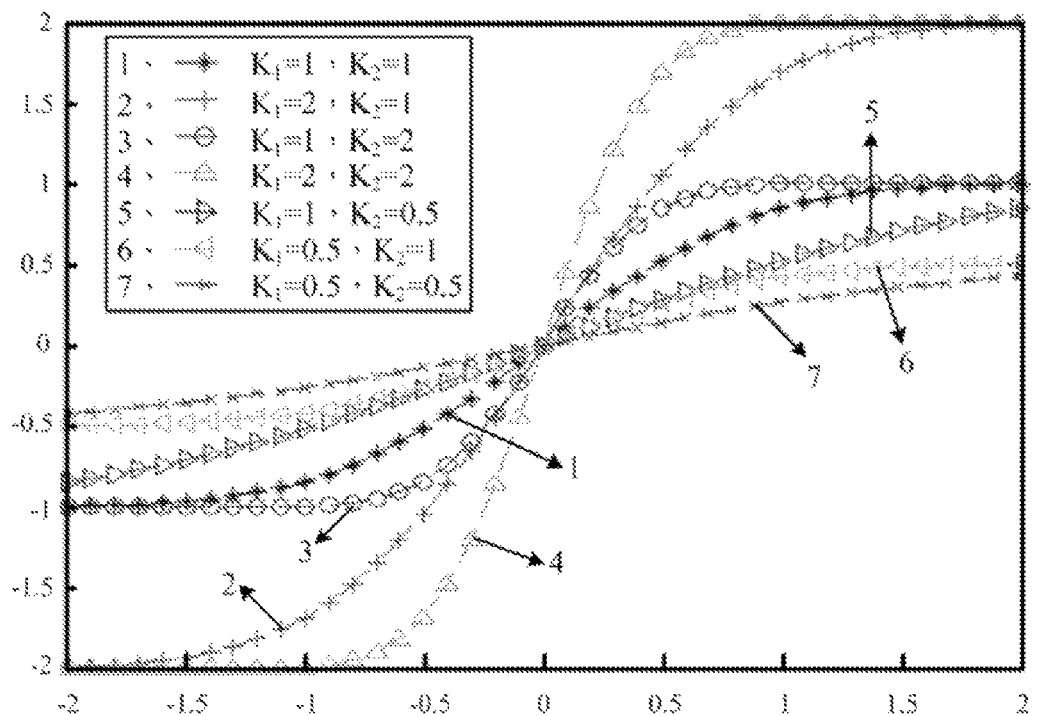
FIG. 4 illustrates a curve of a signal before and after being compressed under different conditions.

The first setting module 24 sets two parameters $K_1$ and $K_2$ for compressing the first communication signal, wherein the parameter $K_1$ is an absolute value of a maximum value between the first in-phase parameter $X_u$ after being compressed and the first quadrate parameter $Y_u$ after being compressed, the parameter $K_2$ is a constant that is set according to need-compression amplitude, the parameters $K_1$ and $K_2$ are both positive real numbers. FIG. 4 illustrates a curve of the signal before and after being compressed under different conditions. Wherein, the horizontal axis represents a value of the signal component before being compressed, the vertical axis represents a value of the compressed signal component.

The parameter $K_1$ determines a range of compressed signal components, for example, when $K_1=1$, the range of the compressed signal components is 【−1, 1】; when $K_1=2$, the range of the compressed signal components is 【−2, 2】. The parameter $K_2$ determines a shape of a curve, for example, when $K_2 \geq 2$, the curve is similar to a reduction curve, since the compression range is relatively larger, at this time the PARA is also larger, but the error rate is larger; when $K_2 \leq 0.5$, the curve approaches a linear curve, at this time the PARA is small, but the error rate is also small. Therefore, the first setting module 24 can set the parameters K1 and K2 according to actual needs, for achieving desired results.

The first calculating module 26 calculates a second compressed in-phase parameter $X_u'$ and a second compressed quadrate parameter $Y_u'$ according to the first in-phase parameter $X_u$, the first quadrate parameter $Y_u$, the parameter $K_1$, the parameter $K_2$ and a compression-transform function. In the illustrated embodiment, the compression-transform function is $X_u' = K_1 * \text{erf}(K_2 * X_u)$, $Y_u' = K_1 * \text{erf}(K_2 * Y_u)$. Wherein, erf represents an error function, also known as the Gaussian error function. The first calculating module 26 calculates $K_2 * X_u$ and $K_2 * Y_u$ at first by the multiplier 602, then calculates $\text{erf}(K_2 * X_u)$ and $\text{erf}(K_2 * Y_u)$ by the integrator 604, at last calculates $K_1 * \text{erf}(K_2 * X_u)$ by the multiplier 602, to get a value of $X_u'$; and calculates $K_1 * \text{erf}(K_2 * Y_u)$, to get a value of $Y_u'$.

The first synthesizing module 28 synthesizes a second compressed communication signal having a compressed in-phase parameter corresponding to the second compressed in-phase parameter $X_u'$ and a compressed quadrate parameter corresponding to the second compressed quadrate parameter $Y_u'$. Amplitude of the second compressed communication signal is $\beta_u = \sqrt{X_u'^2 + Y_u'^2}$; the device 12 compresses the first in-phase parameter $X_u$ and the first quadrate parameter $Y_u$ to the second compressed in-phase parameter $X_u'$ and the second compressed quadrate parameter $Y_u'$, to obtain the compressed amplitude $\beta_u$, the compressed amplitude $\beta_u$ can reduce the PAPR. In the illustrated embodiment, the second compressed communication signal will be transmitted to the receiver 4 after being dealt with digital to analog converting, and power amplifying.

Figure 5:
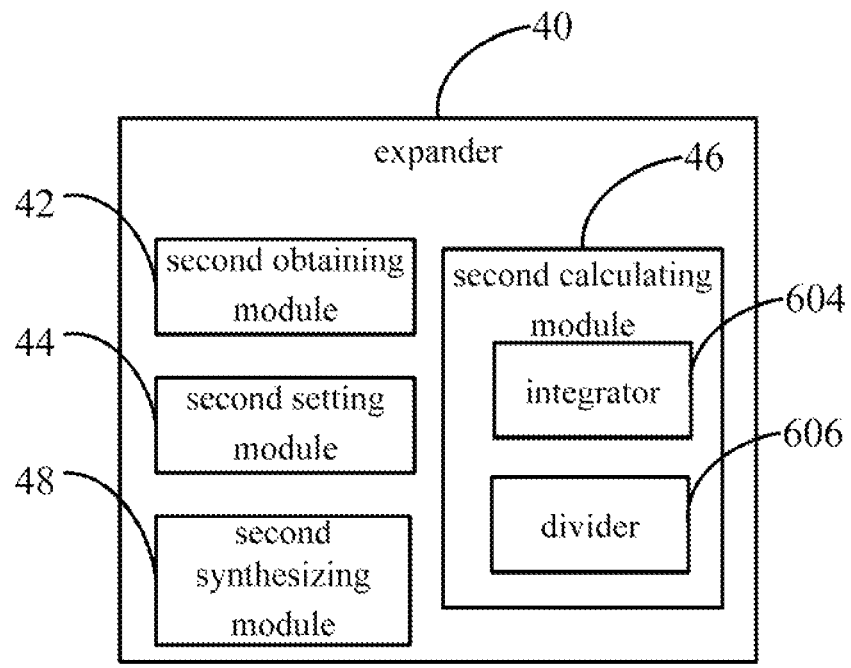
FIG. 5 illustrates a block diagram of an embodiment of function modules of a expander.

FIG. 5 illustrates a block diagram of an embodiment of function modules of the expander 40. The expander 40 includes a second obtaining module 42, a second setting module 44, a second calculating module 46 and a second synthesizing module 48. Wherein, the second synthesizing module 48 includes the integrator 604 and a divider 606.

The second obtaining module 42 analyses the second compressed communication signal that is received, to obtain a third in-phase parameter $X_u''$ and a third quadrate parameter $Y_u''$. In the illustrated embodiment, after being received by the receiver 4 in the multi-carrier communication system 10 and then converted from digital to analog, the second compressed communication signal is obtained.

The second setting module 44 reads the parameters $K_1$ and $K_2$. In the process of transmitting and receiving the same communication signal, the parameters $K_1$ and $K_2$ which the second setting module 44 reads are the first sets from the setting module 24.

The second calculating module 46 calculates a fourth expanded in-phase parameter $X_u'''$ and a fourth expanded quadrate parameter $Y_u'''$ according to the third in-phase parameter $X_u''$, the third quadrate parameter $Y_u''$, the parameter $K_1$, the parameter $K_2$ and a inverse function of the compression-transform function. In the illustrated embodiment, the inverse function of the compression-transform function is $X_u''' = 1/K_2 * \text{erf}(X_u''/K_1)$, $Y_u''' = 1/K_2 * \text{erf}(Y_u''/K_1)$. Wherein, erfinv represents the inverse error function. The second calculating module 46 controls the divider 606 to calculate $X_u''/K_1$ and $Y_u''/K_1$, and then controls the integrator 604 to calculate erfinv $(X_u''/K_1)$ and erfinv$(Y_u''/K_1)$, the final calculates erfinv $(X_u''/K_1)/K_2$ by the divider 606, to get a value of $X_u'''$; and calculates erfinv $(Y_u''/K_1)/K_2$ by the divider 606, to get a value of $Y_u'''$.

The second synthesizing module 48 synthesizes a third expanded communication signal having an expanded in-phase parameter corresponding to the fourth expanded in-phase parameter $X_u'''$ and an expanded quadrate parameter corresponding to the fourth expanded quadrate parameter $Y_u'''$. In the illustrated embodiment, the third expanded communication signal will be stored after being dealt with discrete Fourier transforming, parallel-serial transforming, de-spreading and de-mapping.

Figure 6:
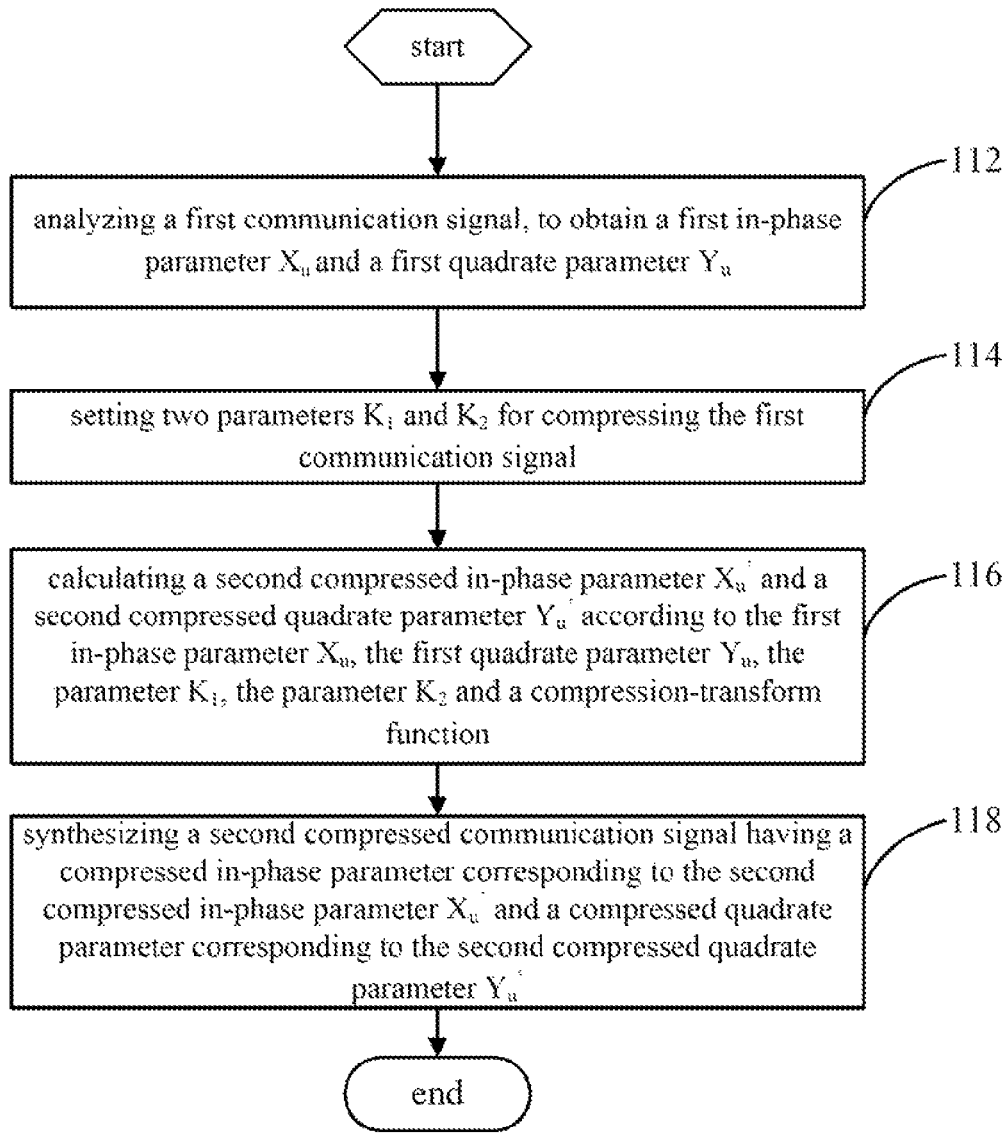
FIG. 6 illustrates a flowchart of an embodiment of a method for educing Peak to average power ratio of communication signal.

FIG. 6 illustrates a flowchart of an embodiment of a method for reducing peak to average power ratio of a communication signal.

At block 112, the first obtaining module 22 analyses a first communication signal, to obtain an first in-phase parameter $X_u$ and a first quadrate parameter $Y_u$. In the illustrated embodiment, the analysis that is used to decompose the first communication signal into two signal components which have a same frequency, have a same amplitude of peak, but are 90 degrees out of phase with each other, generally, a sinusoidal signal is used to describe the first in-phase parameter $X_u$, a cosine signal is used to describe the first quadrate parameter $Y_u$. The amplitude of the first communication signal is $\rho_u = \sqrt{X_u^2 + Y_u^2}$.

At block 114, the first setting module 24 sets two parameters $K_1$ and $K_2$ compressing the first communication signal, wherein the parameter $K_1$ is an absolute value of a maximum value between the first in-phase parameter $X_u$ after being compressed and the first quadrate parameter $Y_u$ after being compressed, and the parameter $K_2$ is a constant that is set according to need-compression amplitude, the parameters $K_1$ and $K_2$ are both positive real numbers.

At block 116, the first calculating module 26 calculates a second compressed in-phase parameter $X_u'$ and a second compressed quadrate parameter $Y_u'$ according to the first in-phase parameter $X_u$, the first quadrate parameter $Y_u$, the parameter $K_1$, the parameter $K_2$ and a compression-transform function. In the illustrated embodiment, the compression-transform function is $X_u' = K_1 * erf(K_2 * X_u)$, $Y_u' = K_1 * erf(K_2 * Y_u)$. Wherein, erf represents an error function, also known as the Gaussian error function. The first calculating module 26 calculates $K_2 * X_u$ and $K_2 * Y_u$ at first by the multiplier 602, then calculates $erf(K_2 * X_u)$ and $erf(K_2 * Y_u)$ by the integrator 604, at last calculates $K_1 * erf(K_2 * X_u)$ by the multiplier 602, to get a value of $X_u'$; and calculates $K_1 * erf(K_2 * Y_u)$, to get a value of $Y_u'$.

At block 118, the first synthesizing module 28 synthesizes a second compressed communication signal having a compressed in-phase parameter corresponding to the second compressed in-phase parameter $X_u'$ and a compressed quadrate parameter corresponding to the second compressed quadrate parameter $Y_u'$. Amplitude of the second compressed communication signal is $\beta_u = \sqrt{X_u'^2 + Y_u'^2}$; the device 12 compresses the first in-phase parameter $X_u$ and the first quadrate parameter $Y_u$ to the second compressed in-phase parameter $X_u'$ and the second compressed quadrate parameter $Y_u'$, to obtain the compressed amplitude $\beta_u$, the compressed amplitude $\beta_u$ can reduce the PAPR.

Figure 7:
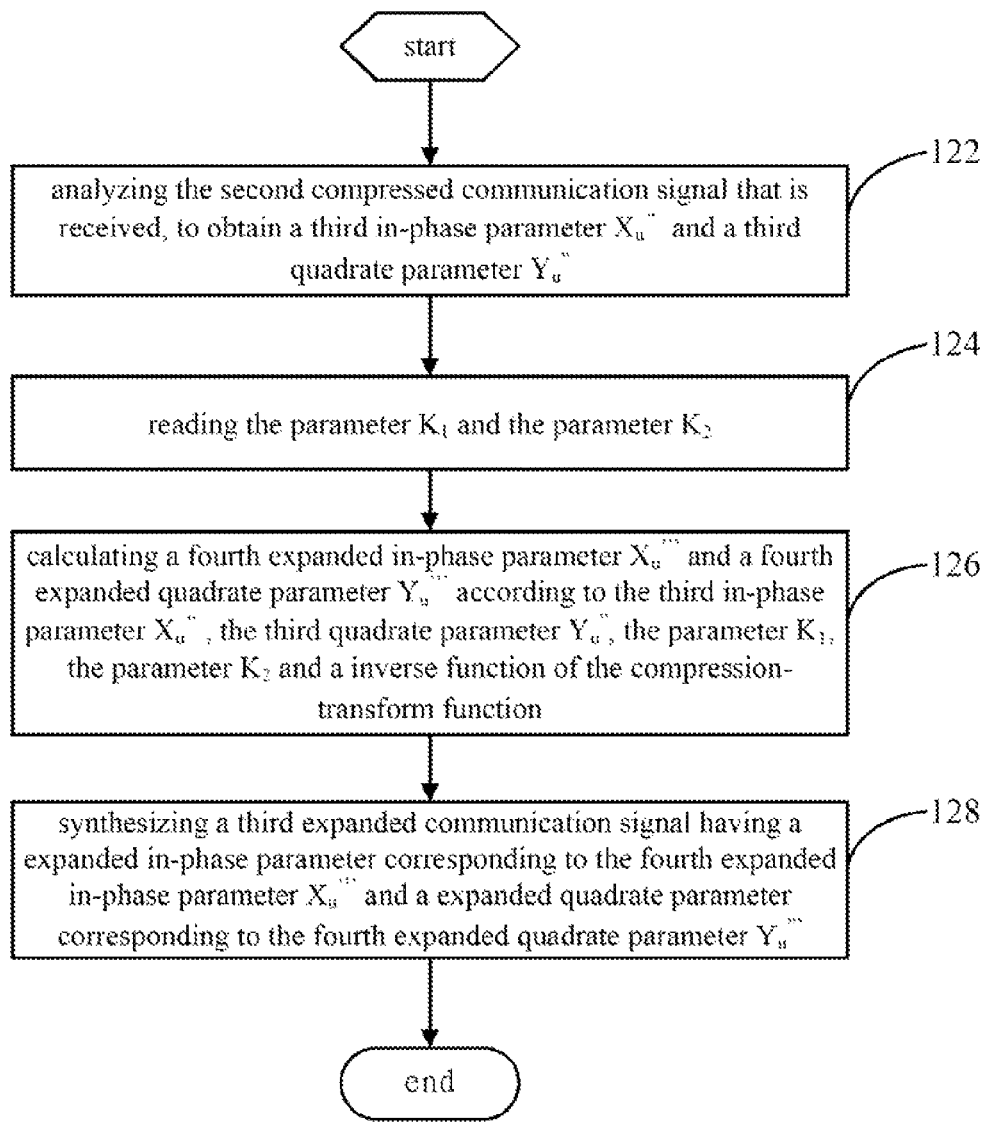
FIG. 7 illustrates a flowchart of an embodiment of a method for educing Peak to average power ratio of communication signal.

FIG. 7 illustrates a flowchart of an embodiment of a method for educing peak to average power ratio of communication signal.

At block 122, the second obtaining module 42 analyses the second compressed communication signal that is received, to obtain a third in-phase parameter $X_u''$ and a third quadrate parameter $Y_u''$.

At block 124, the second setting module 44 reads the parameters $K_1$ and $K_2$. In the process of transmitting and receiving the same communication signal, the parameters $K_1$ and $K_2$ which the second setting module 44 reads are the first sets from the setting module 24.

At block 126, the second calculating module 46 calculates a fourth expanded in-phase parameter $X_u'''$ and a fourth expanded quadrate parameter $Y_u'''$ according to the third in-phase parameter $X_u''$, the third quadrate parameter $Y_u''$, the parameter $K_1$, the parameter $K_2$ and a inverse function of the compression-transforming function. In the illustrated embodiment, the inverse function of the compression-transforming function is $X_u''' = 1/K_2 * erf(X_u''/K_1)$, $Y_u''' = 1/K_2 * erf(Y_u''/K_1)$. Wherein, erfinv represents the inverse error function. The second calculating module 46 controls the divider 606 to calculate $X_u''/K_1$ and $Y_u''/K_1$, and then controls the integrator 604 to calculate $erfinv(X_u''/K_1)$ and $erfinv(Y_u''/K_1)$, the final calculates $erfinv(X_u''/K_1)/K_2$ by the divider 606, to get a value of $X_u'''$; and calculates $erfinv(Y_u''/K_1)/K_2$ by the divider 606, to get a value of $Y_u'''$.

At block 128, the second synthesizing module 48 synthesizes a third expanded communication signal having an expanded in-phase parameter corresponding to the fourth expanded in-phase parameter $X_u'''$ and an expanded quadrate parameter corresponding to the fourth expanded quadrate parameter $Y_u'''$.

Figure 8:
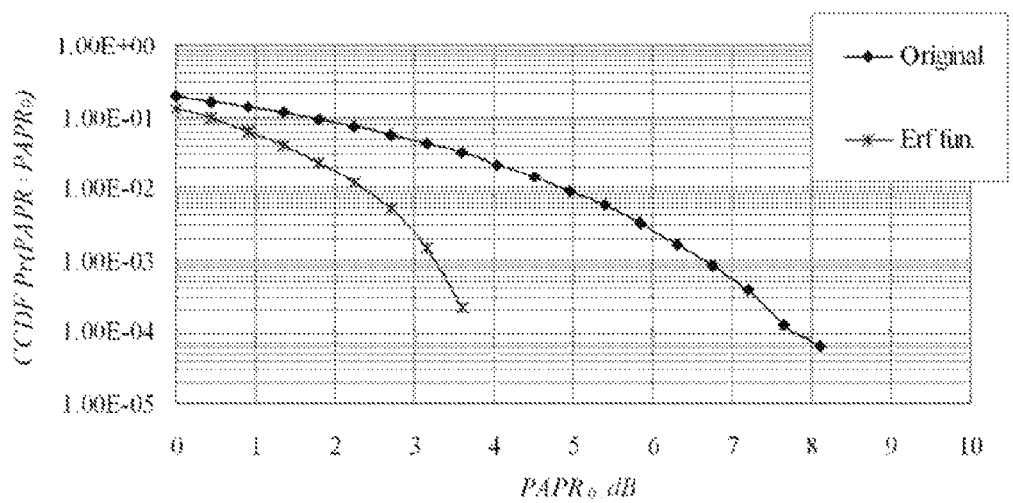
FIGS. 8 and 9 illustrate a complementary cumulative distribution function curve of the signal simulated under different conditions.
Figure 9:
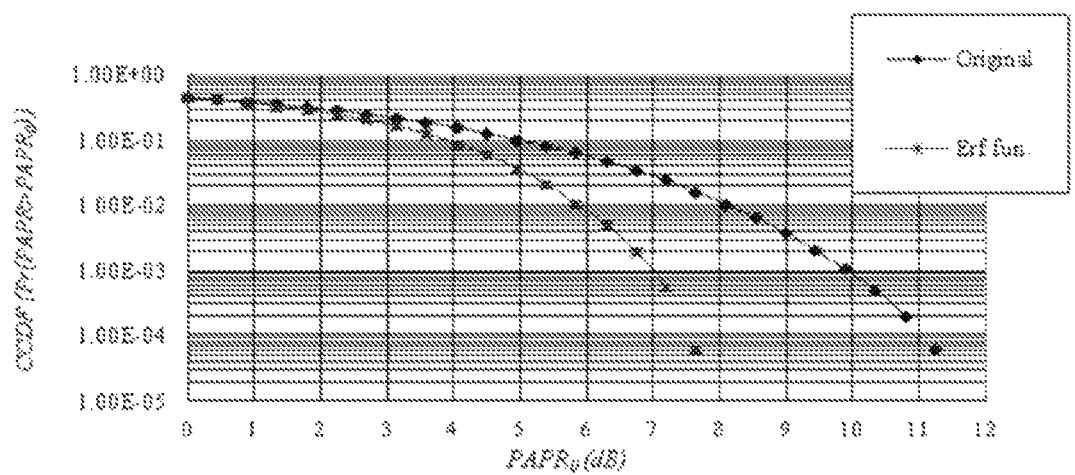

FIGS. 8 and 9 illustrate a complementary cumulative distribution function (CCDF) curve of the signal simulated under different conditions. The CCDF indicates a probability of the PAPR exceeding a threshold $PAPR_0$.

Wherein, FIG. 8 simulation conditions are: bit rate (Rb) of 100 kbps, spread frequency gain (SF) is 8, the number of sub-carriers (U) is 128, the parameter $K_1$ is 24, the parameter $K_2$ is 0.04, each of maximum amplitudes of transmitted communication signals ($A^p_{max}$) is 50, each of average amplitudes of transmitted communication signals is 14, the maximum amplitude of the input amplifier does not operate in a nonlinear range of values that can be tolerated ($A^{PA}_{max}$) is 34. FIG. 9 simulation conditions are: bit rate (Rb) of 100 kbps, spread frequency gain (SF) is 16, the number of sub-carriers (U) is 256, the parameter $K_1$ is 39, the parameter $K_2$ is 0.025, each of the maximum amplitudes of the transmitted communication signals ($A^p_{max}$) is 70, each of the average amplitude of the transmitted communication signals is 20, the maximum amplitude of the input amplifier does not operate in a nonlinear range of values that can be tolerated ($A^{PA}_{max}$) is 52.

Compared to original methods which compress and expand communication signals without using the compressor 20 and the expander 40, the disclosure has a lower probability that PAPR exceeds the threshold $PAPR_0$, the present method can effectively reduce PAPR, to reduce distortion.

It should be emphasized that the above-described embodiments of the present disclosure, including any particular embodiments, are merely possible examples of implementations, set forth for a clear understanding of the principles of the disclosure. Many variations and modifications can be made to the above-described embodiment(s) of the disclosure without departing substantially from the spirit and principles of the disclosure. All such modifications and variations are intended to be included herein within the scope of this disclosure and protected by the following claims.

What is claimed is:

1. A method for reducing peak to average power ratio applied in a device, the device comprising a compressor which includes a processor configured to process a first communication signal, the method comprising:

decomposing the first communication signal into two signal components comprising a first in-phase signal component $X_u$ and a first quadrate signal component $Y_u$;

setting two parameters $K_1$ and $K_2$ for compressing the first communication signal, wherein the parameter $K_1$ is an absolute value of a maximum value between the first in-phase signal component $X_u$ after being compressed and the first quadrate signal component $Y_u$ after being compressed, and the parameter $K_2$ is a constant that is set according to need-compression amplitude;

compressing the first in-phase signal component $X_u$ and the first quadrate signal component $Y_u$ to obtain a second compressed in-phase signal component $X_u'$ and a second compressed quadrate signal component $Y_u'$, according to the parameter $K_1$, the parameter $K_2$, and a compression-transform function; and synthesizing the second compressed in-phase signal component $X_u'$ and the second compressed quadrate signal component $Y_u'$ to a second compressed communication signal.

2. The method as claimed in claim 1, wherein the compression-transform function is: $X_u'=K_1*\text{erf}(K_2*X_u)$, $Y_u'=K_1*\text{erf}(K_2*Y_u)$.

3. The method as claimed in claim 1, further comprising:
decomposing the second compressed communication signal into two signal components comprising a third in-phase signal component $X_u''$ and a third quadrate component $Y_u''$;
reading the parameter $K_1$ and the parameter $K_2$;
expanding the third in-phase signal component $X_u''$ and the third quadrate signal component $Y_u''$ to obtain a fourth expanded in-phase signal component $X_u'''$ and a fourth expanded quadrate signal component $Y_u'''$, according to the parameter $K_1$, the parameter $K_2$ and an inverse function of the compression-transform function; and
synthesizing the fourth expanded in-phase signal component $X_u'''$ and the fourth expanded quadrate signal component $Y_u'''$ to a third expanded communication signal.

4. The method as claimed in claim 3, wherein the inverse function of the compression-transform function is $X_u'''=1/K_2*\text{erf}(X_u''/K_1)$, $Y_u'''=1/K_2*\text{erf}(Y_u''/K_1)$.

5. A device for reducing peak to average power ratio, comprising a compressor:
the compressor comprising:
at least one processor;
a storage system; and
one or more programs that are stored in the storage system and executed by the at least one processor, the one or more programs including instructions for:
decomposing a first communication signal into two signal components comprising a first in-phase signal component $X_u$ and a first quadrate signal component $Y_u$;
setting two parameters $K_1$ and $K_2$ for compressing the first communication signal, wherein the parameter $K_1$ is an absolute value of a maximum value between the first in-phase signal component $X_u$ after being compressed and the first quadrate signal component $Y_u$ after being compressed, and the parameter $K_2$ is a constant that is set according to need-compression amplitude;
compressing the first in-phase signal component $X_u$ and the first quadrate signal component $Y_u$ to obtain a second compressed in-phase signal component $X_u'$ and a second compressed quadrate signal component $Y_u'$, according to the parameter $K_1$, the parameter $K_2$ and a compression-transform function; and
synthesizing the second compressed in-phase signal component $X_u'$ and the second compressed quadrate signal component $Y_u'$ to a second compressed communication signal.

6. The device as claimed in claim 5, wherein the transform function is $X_u'=K_1*\text{erf}(K_2*X_u)$, $Y_u'=*\text{erf}(K_2*Y_u)$.

7. The device as claimed in claim 5, wherein the one or more programs that are stored in the storage system and executed by the at least one processor, the one or more programs further including instructions for:
decomposing the second compressed communication signal into two signal components comprising a third in-phase signal component $X_u''$ and a third quadrate signal component $Y_u''$;
reading the parameter $K_1$ and the parameter $K_2$;
expanding the third in-phase signal component $X_u''$ and the third quadrate signal component $Y_u''$ to obtain a fourth expanded in-phase signal component $X_u'''$ and a fourth expanded quadrate signal component $Y_u'''$, according to the parameter $K_1$, the parameter $K_2$ and a inverse function of the compression-transform function;
synthesizing the fourth expanded in-phase signal component $X_u'''$ and the fourth expanded quadrate signal component $Y_u'''$ to a third expanded communication signal.

8. The device as claimed in claim 7, wherein the inverse function of the compression-transform function is $X_u'''=1/K_2*\text{erf}(X_u''/K_1)$, $Y_u'''=1/K_2*\text{erf}(Y_u''/K_1)$.

* * * * *